US012001280B2

(12) United States Patent
Parat et al.

(10) Patent No.: US 12,001,280 B2
(45) Date of Patent: Jun. 4, 2024

(54) OVERCOMING ERROR CORRECTION CODING MIS-CORRECTS IN NON-VOLATILE MEMORY

(71) Applicant: Intel Corporation, Santa Clara, CA (US)

(72) Inventors: Krishna K. Parat, Palo Alto, CA (US);
Ravi H. Motwani, Fremont, CA (US);
Rohit S. Shenoy, Fremont, CA (US);
Ali Khakifirooz, Brookline, MA (US)

(73) Assignee: Intel Corporation, Santa Clara, CA (US)

( * ) Notice: Subject to any disclaimer, the term of this patent is extended or adjusted under 35 U.S.C. 154(b) by 585 days.

(21) Appl. No.: 17/133,995

(22) Filed: Dec. 24, 2020

(65) Prior Publication Data

US 2021/0117270 A1    Apr. 22, 2021

(51) Int. Cl.
 *G06F 11/00* (2006.01)
 *G06F 11/10* (2006.01)
 *G11C 11/56* (2006.01)
 *G11C 16/26* (2006.01)
 *G11C 16/04* (2006.01)

(52) U.S. Cl.
 CPC ...... *G06F 11/1068* (2013.01); *G11C 11/5621* (2013.01); *G11C 16/26* (2013.01); *G11C 16/0483* (2013.01)

(58) Field of Classification Search
 None
 See application file for complete search history.

(56) References Cited

U.S. PATENT DOCUMENTS

| 10,223,028 | B2* | 3/2019 | Gorobets | G06F 11/076 |
|---|---|---|---|---|
| 11,120,882 | B2* | 9/2021 | Ioannou | G11C 29/52 |
| 2004/0255090 | A1* | 12/2004 | Guterman | G11C 16/349 |
| | | | | 711/156 |
| 2008/0077841 | A1* | 3/2008 | Gonzalez | G11C 16/3422 |
| | | | | 714/763 |
| 2018/0024881 | A1* | 1/2018 | Lu | G11C 29/52 |
| | | | | 714/764 |
| 2018/0350446 | A1* | 12/2018 | K | G11C 29/76 |
| 2020/0066354 | A1* | 2/2020 | Ioannou | G11C 16/26 |

* cited by examiner

*Primary Examiner* — Mujtaba M Chaudry
(74) *Attorney, Agent, or Firm* — Compass IP Law PC

(57) ABSTRACT

Error correction coding (ECC) mis-corrected reads, if undetected, result in silent data corruption of a non-volatile memory device. Overcoming ECC mis-corrected reads is based on a read signature of a result of reading a page in the non-volatile memory device. An ECC mis-correct logic counts the number of bits in the end-most buckets into which the bits of the result is divided. End-most buckets that are overpopulated or starved reveal a tell-tale read signature of an ECC mis-correct. The ECC mis-correct is likely to occur when the read reference voltage level used to read the page is shifted in one direction or another to an extreme amount that risks reading data from a different page. Detecting ECC mis-corrected reads can be used to overcome the ECC mis-corrects and mitigate silent data corruption.

21 Claims, 5 Drawing Sheets

OVERCOMING ERROR CORRECTION CODING MIS-CORRECTS IN NON-VOLATILE MEMORY

FIELD

This disclosure relates to multi-threshold level non-volatile memory and in particular to improving error correction when reading multi-threshold level cells of non-volatile memory.

BACKGROUND

Non-volatile memory refers to memory whose state is determinate even if power is interrupted to the device. Storage devices that include non-volatile memory include, among others, a secure digital card, a multimedia card, a NAND flash drive (for example, a Universal Serial Bus (USB) flash drive also known as a "USB thumb drive" or "USB memory stick" that includes non-volatile memory with an integrated USB interface), and a solid-state drive (SSD).

The non-volatile memory can comprise a block-addressable memory device, such as NAND, or more specifically, multi-threshold level NAND flash memory (for example, Single-Level Cell ("SLC"), Multi-Level Cell ("MLC"), Quad-Level Cell ("QLC"), Tri-Level Cell ("TLC"), Penta-Level Cell ("PLC"), or some other NAND), or non-volatile storage devices including 2, 4, 8, 16 levels of information, or other number of levels of information, and so forth.

A NAND flash cell uses the threshold voltage of a floating-gate transistor to represent the data stored in the cell. In a SLC NAND flash memory, each memory cell has two voltage levels corresponding to two states (0, 1) to represent one bit. In MLC, TLC, QLC and PLC NAND flash memory, each memory cell stores more than one bit. For example, each cell in an MLC NAND flash memory uses four voltage levels corresponding to four states (00, 01, 10, 11) to represent 2 bits of binary data. Each cell in a TLC NAND flash memory uses eight voltage levels corresponding to eight states (000 to 111) to represent 3 bits of binary data. Each cell in a QLC NAND flash memory uses sixteen voltage levels corresponding to sixteen states (0000 to 1111) to represent 4 bits of binary data.

NAND flash memory with a greater number of voltage levels stores data in each cell of a NAND array more densely than memory with fewer voltage levels. However, increases in storage density can lead to decreases in memory reliability. Reliability of memory can be improved with the application of error correction coding (ECC) schemes. Even so, some ECC schemes are unable to detect certain types of errors when reading NAND flash memory. The inability to detect such errors results in what is referred to as silent data corruption.

BRIEF DESCRIPTION OF THE DRAWINGS

The accompanying drawings illustrate various embodiments and aspects of the invention and are not to be construed as limiting the invention. In certain instances, well-known or conventional details are not illustrated in order to provide a concise discussion of embodiments of the present inventions. Features of embodiments of the claimed subject matter will become apparent in the following detailed description and upon reference to the drawings, in which like numerals depict like parts, and in which:

DETAILED DESCRIPTION

A multi-threshold level NAND flash memory cell is programmed to one of N-level threshold voltages based on the logical multi-bit value that the NAND flash memory cell represents. The logical multi-bit value stored in the NAND flash memory cell is read by comparing a threshold voltage of the NAND flash memory cell with a read reference voltage, denoted as R1, R2, R3, . . . . A NAND flash memory cell that is encoded to store multiple bits may form a part of multiple different pages, with each bit of the cell corresponding to a distinct page.

For example, for a cell that is encoded with two bits (i.e., using an MLC encoding scheme), one bit may correspond to an Upper Page (UP) and the other bit may correspond to a Lower Page (LP). As another example, for a cell that is encoded with three bits (i.e., using a TLC encoding scheme), one bit may correspond to an LP, one bit may correspond to a UP, and the other bit may correspond to an Extra Page (XP). As yet another example, for a cell that is encoded with four bits (i.e., using a QLC encoding scheme), one bit may correspond to an LP, another bit may correspond to a UP, another bit may correspond to an XP, and the final bit may correspond to a Top Page (TP). Each page (e.g., LP, UP, XP, or TP) may comprise an aggregation of corresponding bits stored by a plurality of different memory cells of a wordline in a NAND array. For example, all of the right-most bits of a plurality of memory cells encoded using a TLC scheme may form an LP, all of the middle bits of the plurality of cells may form a UP, and all of the left-most bits of the plurality of cells may form an XP.

Figure 1A:
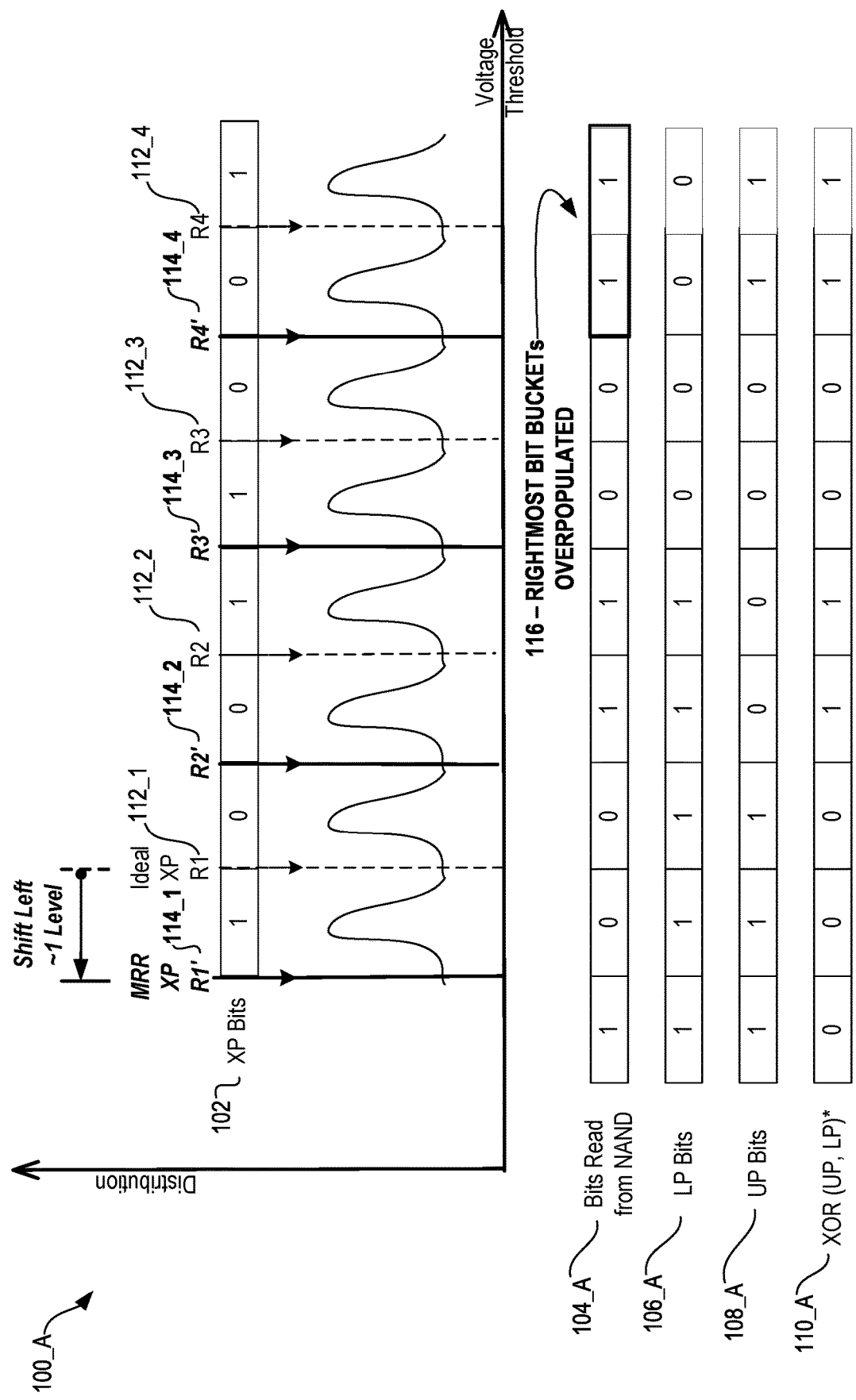
FIGS. 1A-1B illustrate voltage regions for multiple pages (upper page, lower page and extra page) in a NAND flash memory cell along with corresponding example bit values.

FIG. 1A illustrates voltage regions for multiple pages (LP, UP and XP) of memory cells encoded using a QLC scheme. To read the XP bits 102, the threshold voltage of the cells is initially compared against read reference voltages R1, 112_1, R2, 112_2, R3, 112_3 and R4, 112_4, referred to herein as an ideal reference voltage. Cells with a threshold voltage higher than the reference voltages R1, R2, R3 and R4 are identified as 0 and cells with threshold voltage lower than the reference voltages are identified as 1.

During the XP read, the bits are divided into four buckets 104_A, that correspond to the voltage level of the cell. In practice, some error is inevitable when reading the data from some of the cells. For example, some of the cells may be incorrectly read as 1 and some of the cells may be incorrectly read as 0. Various types of NAND flash memory may utilize various error correction schemes to dynamically change, or move, read reference voltages responsive to read errors. This is because read errors may originate from numerous error mechanisms and different usage models that alter memory cell threshold voltage distributions.

The threshold voltage of the NAND flash memory cell can change, for example, due to program/erase (PE) cycling of the NAND flash memory cell (also referred to as endurance), loss of charge in the NAND flash memory cell (also referred to as data retention) or interference when a neighboring NAND flash memory cell is read (also referred to as read disturb). A change in the threshold voltage of the NAND flash memory cell can result in a read error. For example, an MLC NAND flash memory cell storing a logical two-bit value can be misread as storing a different logical two-bit value. Error correcting codes (ECC) are used to detect and correct bit errors that may occur in the NAND flash memory. The read reference voltages can be adjusted and the read performed (one or more times) using another read reference voltage (also referred to as read retry or moving read reference (MRR) voltage) until the read error (for example, error checking code (ECC) data) is minimized or eliminated.

The memory controller contains read reference voltages that are stored in a moving read reference (MRR) table and can be selected during a read retry operation (or MRR operation) to minimize or eliminate a read error. For example, for a QLC NAND device there are four pages (TP, XP, UP, LP) per wordline and each page has a set of read reference voltages. In one example, the top page (TP) has eight read reference voltages, the extra page (XP) has four read reference voltages, the upper page (UP) has two read reference voltages, and the lower page (LP) has one read reference voltage. The MRR table entries of a memory controller control under what scenarios the read reference voltages can be shifted (moved), including the direction and the amount of the shift.

In a NAND flash memory device, MRR can support reads which potentially move read references by one full level. For example, an MRR shifted reference voltage which supports retention or other high charge loss scenarios can shift ideal read references by almost one level to the left or right. However, an MRR shift of the read reference voltage by one level to the left for an extra page (XP) read leads to a read of the exclusive OR (XOR) of the upper page (UP) and lower page (LP) data. Since the ECC codeword space is a linear space, the XOR of the UP and LP ECC codewords is a valid ECC codeword. Such reads are considered ECC mis-corrects because the ECC encoding mistakenly "corrected" an XP read using an XOR (UP, LP) ECC codeword. Moreover, a successful decode of the XOR of the UP and LP ECC that results in a mis-correct will not be detected by a cyclic redundancy check (CRC) either since the CRC is also a linear code.

In FIG. 1A, for example, an MRR reference voltage, MRR XP R1', 114_1, is applied to shift the ideal XP reference voltage R1, 112_1, nearly one level to the left. An XP read at the R1' reference voltage will read the XOR 110_A of the UP 108_A and LP 106_A codewords, except for the left-most bucket. But since the left-most bucket has very few bits which are not the XOR of the UP and LP bits, the XOR is a valid ECC codeword. An ECC decoder can flip these bits to successfully decode to the XOR of the UP and LP codewords.

Because the successful decode of the XOR of the UP and LP ECC cannot be detected by the CRC, the XP read at the R1' reference voltage leads to an ECC mis-correct. Any other ECC check that is closed under linearity will also pass. The undetected ECC mis-correct counts towards a silent data corruption (SDC) count. Because the non-volatile memory industry qualifications for SDC counts are very stringent, undetected SDC during a NAND flash qualification test or during operation is undesirable.

It is not possible to remove the extreme MRR support of shifting reference voltages nearly one level to the left or right for retries of reads. Retention or other scenarios leading to high charge loss are valid scenarios in which reading non-volatile memory requires MRR support. Therefore, to overcome the challenge of ECC mis-corrects and SDC, while still allowing MRR support, embodiments for overcoming ECC mis-corrects in NAND flash non-volatile memory use a different mechanism to identify when an ECC mis-correct has occurred, namely a read signature.

For example, referring to FIG. 1A, one of the read signatures of an ECC mis-correct resulting from a shifted read reference by one level to the left is that the left-most bucket of the bits read from the NAND 104_A is starved, and/or the right-most bucket has roughly twice the number of expected bits. In the XP read example of FIG. 1A, the right-most bucket 116 is overpopulated with one fourth of the bits instead of one eighth of the bits as a result of the left-shifted read voltage R4', 114_4.

Figure 1B:
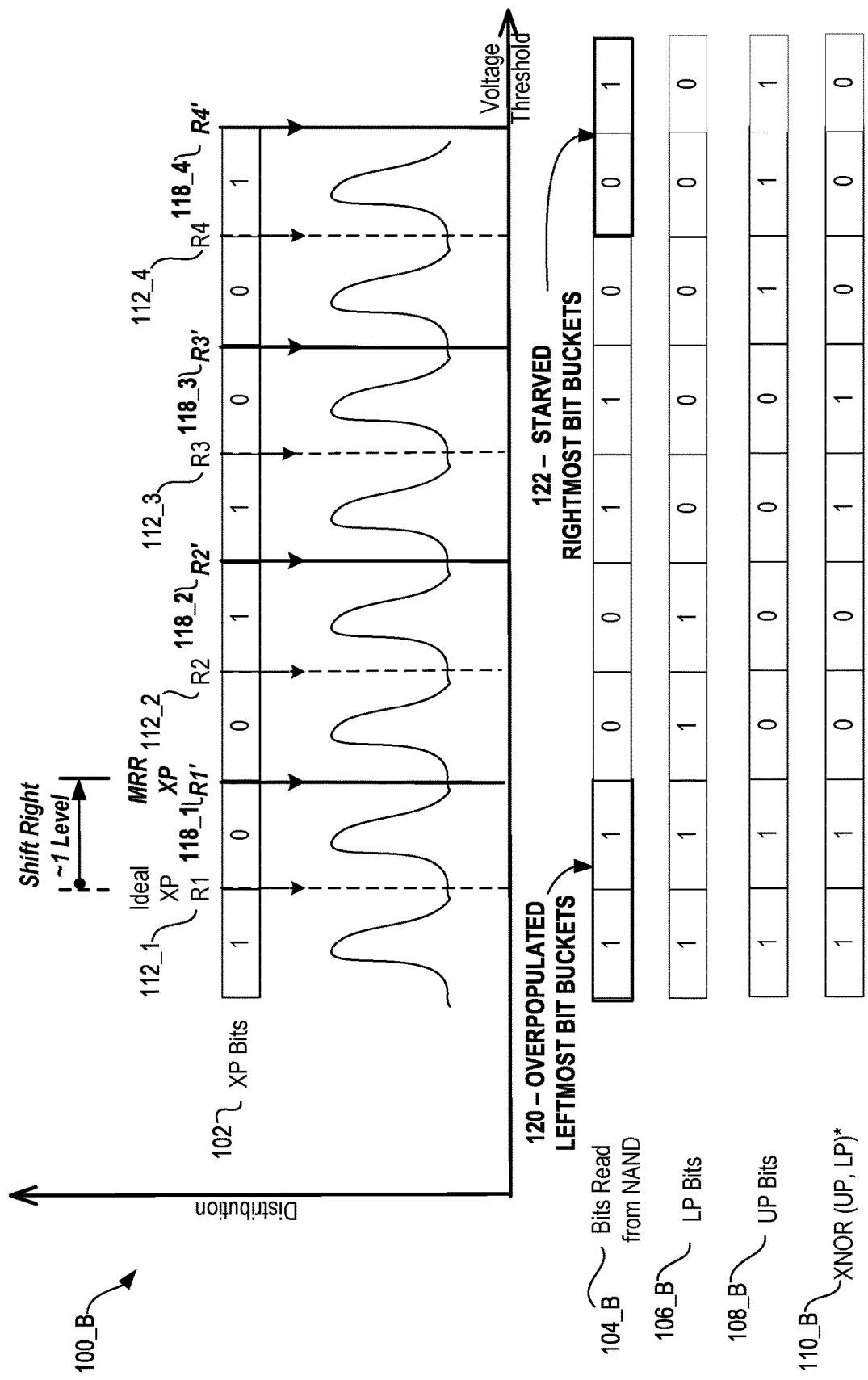

As another example, referring to FIG. 1B, the left-most bit bucket 120 is overpopulated with one fourth of the bits instead of one eighth of the bits as a result of the right-shifted read voltage R1' 118_1. In addition, the right-most bit bucket 122 is starved, having been erased as a result of the right-shifted read voltage R4', 118_4. These types of read signatures are indicative of an ECC mis-correct because read references shifted by one level to the right result in a read of the XNOR 110_B of the UP bits 108_B and LP bits 106_B. Like the XOR of the UP and LP bits, the XNOR 110_B of the UP bits 108_B and LP bits 106_B can be a valid ECC codeword and unable to be detected with a CRC.

Other MRR shifted read scenarios may lead to a read of some Boolean function of other page data besides those shown in FIGS. 1A and 1B. Any MRR shifted read that moves read references to the left or right by a significant amount can result in the left-most and right-most bucket read signatures that reveal that an ECC mis-correct has occurred. For this reason, the left-most and right-most buckets into which bits are divided during a page read can be used to detect an extreme unwanted shift of the read reference voltages that can result in an ECC mis-correct and SDC. Other encoding schemes other than the QLC encoding scheme illustrated in FIGS. 1A and 1B can be used when overcoming ECC mis-corrects in accordance with the embodiments described herein. For example, MLC, TLC and PLC schemes for encoding multi-level cells can also benefit from overcoming ECC mis-corrects in accordance with the embodiments described herein.

Embodiments of overcoming ECC mis-corrects in non-volatile memory include counting the number of bits in each bucket and checking the resulting signature. The counting can be performed for any NAND read (or pre-read) with a read level indicator ON that results in MRR support or some other type of read reference voltage shift. In some cases, if the latency of the read with a read level indicator ON is unacceptable, then a specialized read command that forces a read at one or more of the extreme left-shifted and right-shifted read reference voltages can be performed to enable counting the number of bits in each bucket, checking the read signatures that result, and detecting the presence of SDC.

Figure 2:
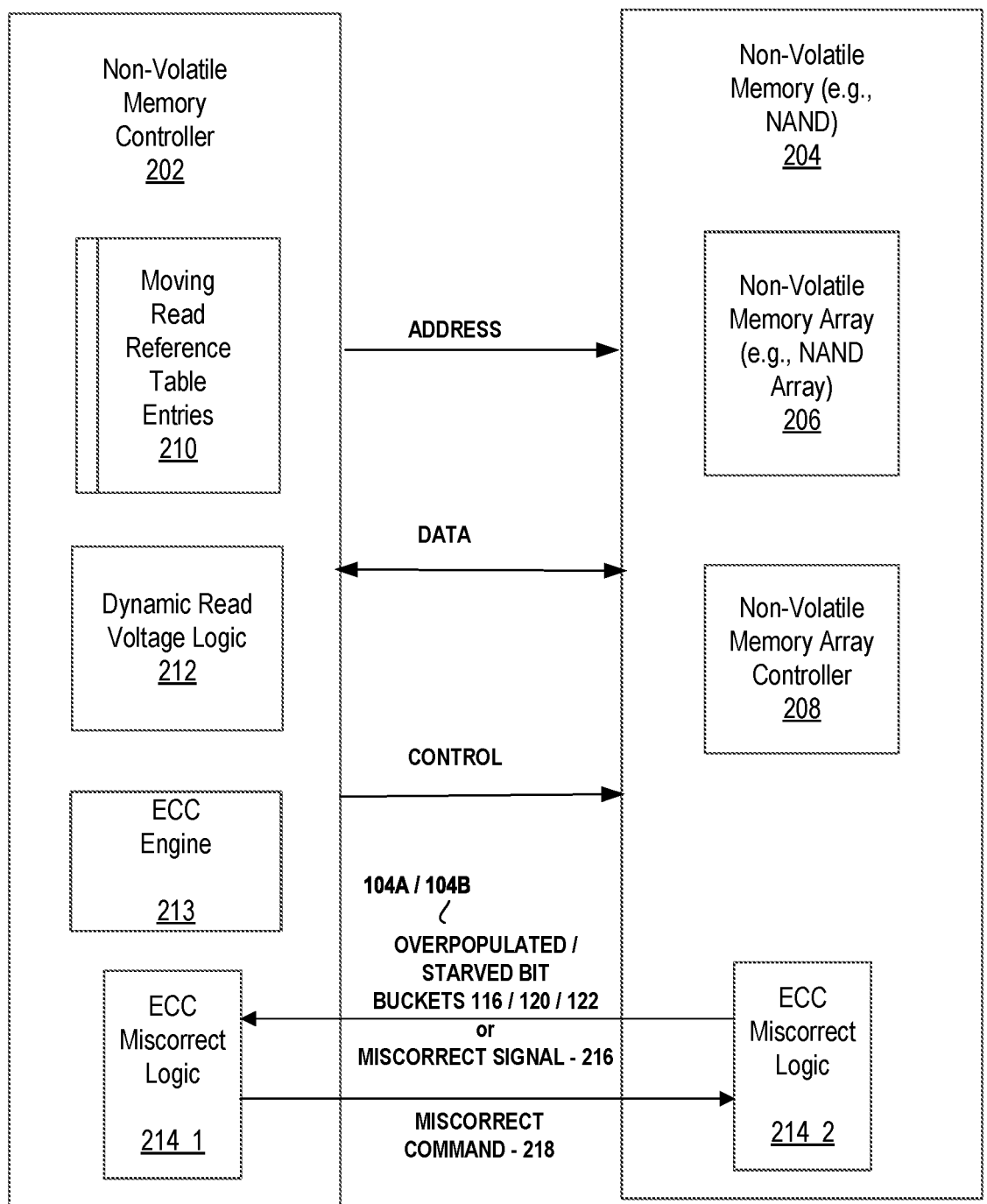
FIG. 2 is a block diagram of a non-volatile memory storage system that includes a non-volatile memory controller and a non-volatile memory device in which an embodiment of overcoming ECC mis-corrects can be implemented.

FIG. 2 is a block diagram of a non-volatile memory storage system that includes a non-volatile memory controller and a non-volatile memory device in which an embodiment of overcoming ECC mis-corrects can be implemented.

A non-volatile memory system 200 such as a storage device (e.g., a solid state drive (SSD)) includes a non-volatile memory controller 202 and a non-volatile memory device 204 (e.g., a NAND). The non-volatile memory controller 202 and the non-volatile memory device 204 are coupled via a control bus, data bus and address bus. The non-volatile memory device 204 includes a non-volatile memory array 206 and a non-volatile memory array controller 208.

The non-volatile memory controller 202 includes a non-volatile memory to store moving read reference (MRR) table entries 210 and a dynamic read voltage logic 212 to provide MRR support for read failures or to proactively avoid read failures. The non-volatile memory controller 202 further includes an ECC engine 213 to provide error correction support for multi-level memory cell reads of the memory cells of the non-volatile memory array 206.

To overcome ECC mis-corrects, the non-volatile memory controller 202 further includes an ECC Mis-correct logic 214_1. In some embodiments, some or all of the ECC Mis-correct logic 214_1 can be alternatively implemented directly in the non-volatile memory (e.g., the NAND) 204 as ECC Mis-correct logic 214_2. The ECC Mis-correct logic 214_2 transmits bit buckets 104A/104B, including overpopulated and starved bit buckets 116/120/122, to the ECC Mis-correct logic 214_1 for counting and detection of signatures that indicate the presence of silent data corruption (SDC). Alternatively, the ECC Mis-correct logic 214_2 counts the bit buckets 104A/104B directly in the NAND and instead notifies the non-volatile memory controller 202 with a mis-correct signal 216 when a mis-correct signature has been detected as a result of the counting. Counting the bit buckets directly in the NAND circuitry 204 reduces latency associated with the ECC Mis-correct logic due to avoiding the expense of transferring the bit buckets from the NAND circuitry 204 to the non-volatile memory controller 202. However, the circuitry for counting the bit buckets and comparing the MRR shift to a threshold voltage shift value (as described in further detail in FIG. 3) can be expensive to add to the NAND circuitry 204. Adding circuitry or implementing the ECC Mis-correct logic 214_1 entirely within the non-volatile memory controller 202, either in firmware or software, is likely less expensive.

In some embodiments, the ECC Mis-correct logic 214_1 transmits a Mis-correct command 218 to the NAND 204 to forcibly trigger shifted reads that enable the counting of the bit buckets to reveal the read signatures that can indicate the presence of a mis-correct and SDC. For example, the Mis-correct command 218 can be transmitted from the non-volatile memory controller 202 to the NAND 204 via the control bus.

Figure 3:
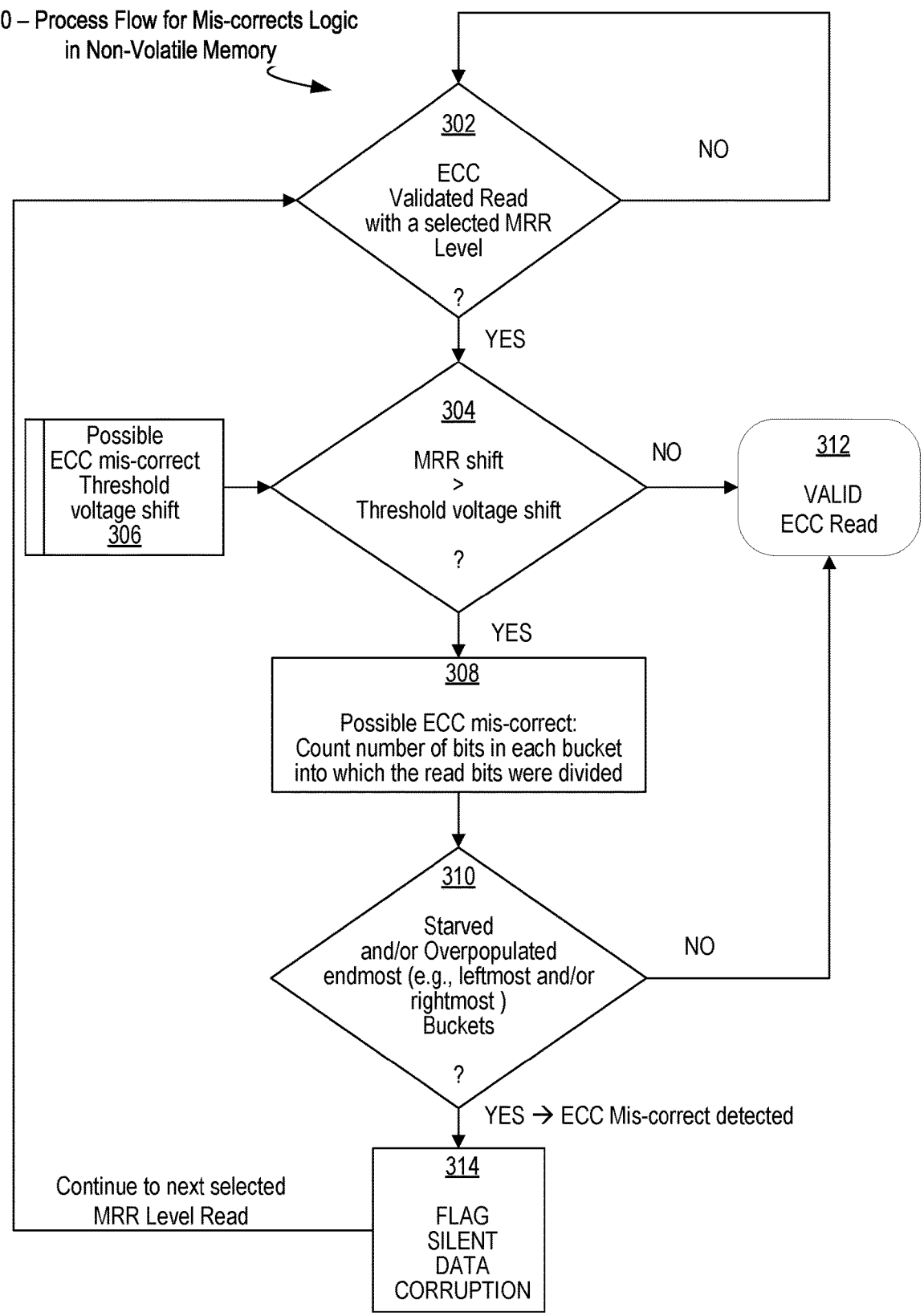
FIG. 3 is process flow diagram of an embodiment of a method to overcome ECC mis-corrects which can be implemented in a non-volatile memory storage system as illustrated in FIG. 2.

FIG. 3 is process flow diagram of an embodiment of an ECC Mis-correct Logic 300 which can be implemented in a non-volatile memory storage system 200 as illustrated in FIG. 2. At 302, the logic begins with determining whether the ECC scheme has validated a read that was performed with a read level ON, e.g., a selected MRR level that shifted the voltage in one or the other direction. If the determination at 302 is NO, then the processing loops back to await the next ECC validated read at 302. If the determination at 302 is YES, the logic continues at 304 to further determine whether the voltage shift based on the MRR level exceeded a Mis-correct threshold voltage shift 306 for checking a possible ECC mis-correct to trigger the remainder of the processes for overcoming a possible ECC mis-correct. The use of a Mis-correct threshold voltage shift 306 for checking a possible ECC mis-correct ensures that only the MRR-based reads that shifted the reference read voltages by an extreme amount, e.g., close to an entire read reference level, are checked for a possible ECC mis-correct occurrence. If the determination at 304 is NO, it means that the read is valid with no possibility of ECC mis-correct and therefore processing stops at 312. If the determination of at 304 is YES, then the processing continues at 308, to count the number of bits in each bucket into which the read bits were divided. At 310, the logic continues to determine whether the read signature of the bit buckets indicate the presence of starved buckets or overpopulated buckets at either the right-most or left-most buckets. If NO, the system determines that there is no ECC mis-correct and data is valid. Processing therefore stops at 312. If the determination at 310 is YES, then at 314, the read is flagged with silent data corruption and processing continues, looping back to the process at 302 to await the next ECC validated read with the next selected MRR Level.

In operation, the logic 300 is triggered during a NAND flash qualification test of random reads to determine the presence (or absence) of silent data corruption (SDC). The logic 300 can also be implemented as an ongoing process for overcoming ECC mis-corrects that lead to SDC on a routine basis and/or on-demand. For example, by flagging the occurrence of SDC, the set of read reference voltage levels and voltage level shifts specified in the MRR entries can be re-calibrated to avoid or reduce the occurrence of SDC.

Figure 4:
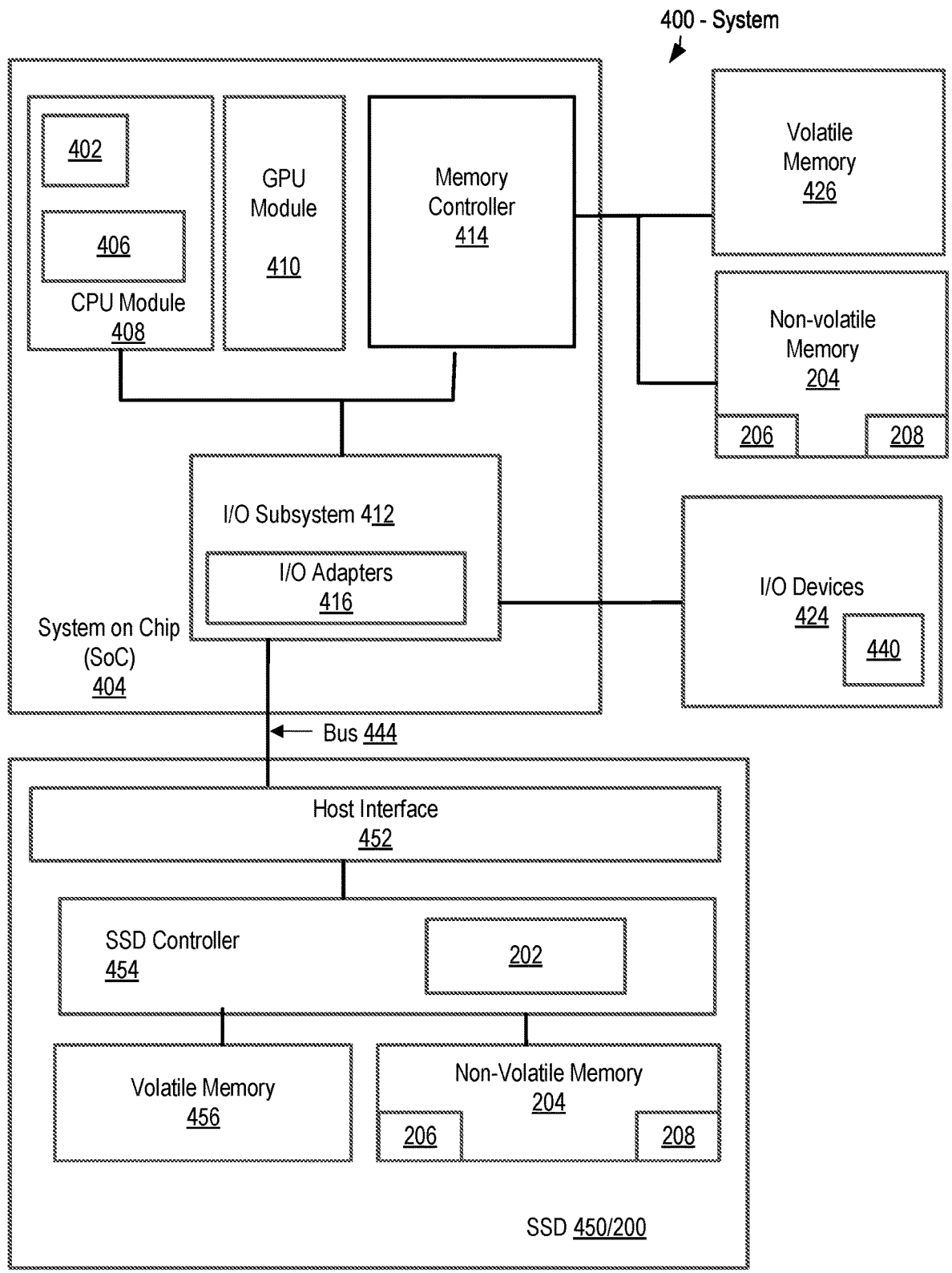
FIG. 4 is a block diagram of an embodiment of a computer system that includes a non-volatile memory controller and a non-volatile memory device in which an embodiment of overcoming ECC mis-corrects can be implemented.

FIG. 4 is a block diagram of an embodiment of a computer system 400 that includes a memory controller 414 to control volatile memory 426 and non-volatile memory 204. Computer system 400 can correspond to a computing device including, but not limited to, a server, a workstation computer, a desktop computer, a laptop computer, and/or a tablet computer.

The computer system 400 includes a system on chip (SoC) 404 which combines processor, graphics, memory, and Input/Output (I/O) control logic into one SoC package. The SoC 404 includes at least one Central Processing Unit (CPU) module 408, the memory controller 414, and a Graphics Processor Unit (GPU) 410. In other embodiments, the memory controller 414 can be external to the SoC 404. The CPU module 408 includes at least one processor core 402, and a level 2 (L2) cache 406.

Although not shown, each of the processor core(s) 402 can internally include one or more instruction/data caches, execution units, prefetch buffers, instruction queues, branch address calculation units, instruction decoders, floating point units, retirement units, etc. The CPU module 408 can correspond to a single core or a multi-core general purpose processor, such as those provided by Intel® Corporation, according to one embodiment.

The Graphics Processor Unit (GPU) 410 can include one or more GPU cores and a GPU cache which can store graphics related data for the GPU core. The GPU core can internally include one or more execution units and one or more instruction and data caches. Additionally, the Graphics Processor Unit (GPU) 410 can contain other graphics logic units that are not shown in FIG. 4, such as one or more vertex processing units, rasterization units, media processing units, and codecs.

Within the I/O subsystem 412, one or more I/O adapter(s) 416 are present to translate a host communication protocol utilized within the processor core(s) 402 to a protocol compatible with particular I/O devices. Some of the protocols that adapters can be utilized for translation include Peripheral Component Interconnect (PCI)-Express (PCIe); Universal Serial Bus (USB); Serial Advanced Technology Attachment (SATA) and Institute of Electrical and Electronics Engineers (IEEE) 1594 "Firewire".

The I/O adapter(s) 416 can communicate with external I/O devices 424 which can include, for example, user interface device(s) including a display and/or a touch-screen display 440, printer, keypad, keyboard, communication logic, wired and/or wireless, storage device(s) including hard disk drives ("HDD"), solid-state drives ("SSD"), removable storage media, Digital Video Disk (DVD) drive, Compact Disk (CD) drive, Redundant Array of Independent Disks (RAID), tape drive or other storage device. The storage devices can be communicatively and/or physically coupled together through one or more buses using one or more of a variety of protocols including, but not limited to, SAS (Serial Attached SCSI (Small Computer System Interface)), PCIe (Peripheral Component Interconnect Express), NVMe (NVM Express) over PCIe (Peripheral Component Interconnect Express), and SATA (Serial ATA (Advanced Technology Attachment)).

Additionally, there can be one or more wireless protocol I/O adapters. Examples of wireless protocols, among others, are used in personal area networks, such as IEEE 802.15 and Bluetooth, 4.0; wireless local area networks, such as IEEE 802.11-based wireless protocols; and cellular protocols.

The I/O adapter(s) 416 can also communicate with a solid-state drive ("SSD") 450/200 which includes an SSD controller 454/202, a host interface 452 and non-volatile memory device 204 that includes one or more non-volatile memory arrays 206 and non-volatile memory controllers 208.

A non-volatile memory (NVM) device 204 is a memory whose state is determinate even if power is interrupted to the device. In one embodiment, the NVM device 204 that includes the one or more NVM arrays 206 and NVM controllers 208 can comprise a block addressable memory device, such as NAND technologies, or more specifically, multi-threshold level NAND flash memory (for example, Single-Level Cell ("SLC"), Multi-Level Cell ("MLC"), Quad-Level Cell ("QLC"), Tri-Level Cell ("TLC"), and Penta-Level Cell ("PLC") or some other NAND).

The I/O adapters 416 can include a Peripheral Component Interconnect Express (PCIe) adapter that is communicatively coupled using the NVMe (NVM Express) over PCIe (Peripheral Component Interconnect Express) protocol over bus 444 to a host interface 452 in the SSD 450/200. Non-Volatile Memory Express (NVMe) standards define a register level interface for host software to communicate with a non-volatile memory subsystem (for example, a Solid-state Drive (SSD)) over Peripheral Component Interconnect Express (PCIe), a high-speed serial computer expansion bus). The NVM Express standards are available at www.nvmexpress.org. The PCIe standards are available at www.pcisig.com.

Volatile memory 456 is memory whose state (and therefore the data stored in it) is indeterminate if power is interrupted to the device. Dynamic volatile memory requires refreshing the data stored in the device to maintain state. One example of dynamic volatile memory incudes DRAM (Dynamic Random Access Memory), or some variant such as Synchronous DRAM (SDRAM). A memory subsystem as described herein can be compatible with a number of memory technologies, such as DDR3 (Double Data Rate version 3, original release by JEDEC (Joint Electronic Device Engineering Council) on Jun. 27, 2007). DDR4 (DDR version 4, initial specification published in September 2012 by JEDEC), DDR4E (DDR version 4), LPDDR3 (Low Power DDR version3, JESD209-3B, August 2013 by JEDEC), LPDDR4) LPDDR version 4, JESD209-4, originally published by JEDEC in August 2014), WIO2 (Wide Input/Output version 2, JESD229-2 originally published by JEDEC in August 2014, HBM (High Bandwidth Memory, JESD325, originally published by JEDEC in October 2013, DDR5 (DDR version 5, currently in discussion by JEDEC), LPDDR5 (currently in discussion by JEDEC), HBM2 (HBM version 2), currently in discussion by JEDEC, or others or combinations of memory technologies, and technologies based on derivatives or extensions of such specifications. The JEDEC standards are available at www.jedec.org.

An operating system is software that manages computer hardware and software including memory allocation and access to I/O devices. Examples of operating systems include Microsoft® Windows®, Linux®, iOS® and Android®. Flow diagrams as illustrated herein provide examples of sequences of various process actions. The flow diagrams can indicate operations to be executed by a software or firmware routine, as well as physical operations. In one embodiment, a flow diagram can illustrate the state of a finite state machine (FSM), which can be implemented in hardware and/or software. Although shown in a particular sequence or order, unless otherwise specified, the order of the actions can be modified. Thus, the illustrated embodiments should be understood as an example, and the process can be performed in a different order, and some actions can be performed in parallel. Additionally, one or more actions can be omitted in various embodiments; thus, not all actions are required in every embodiment. Other process flows are possible.

To the extent various operations or functions are described herein, they can be described or defined as software code, instructions, configuration, and/or data. The content can be directly executable ("object" or "executable" form), source code, or difference code ("delta" or "patch" code). The software content of the embodiments described herein can be provided via an article of manufacture with the content stored thereon, or via a method of operating a communication interface to send data via the communication interface. A machine readable storage medium can cause a machine to perform the functions or operations described and includes any mechanism that stores information in a form accessible by a machine (e.g., computing device, electronic system, etc.), such as recordable/non-recordable media (e.g., read only memory (ROM), random access memory (RAM), magnetic disk storage media, optical storage media, NAND flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface can be configured by providing configuration parameters and/or sending signals to prepare the communication interface to provide a data signal describing the software content. The communication interface can be accessed via one or more commands or signals sent to the communication interface.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Although the foregoing detailed description referenced illustrative embodiments of the claimed subject matter, many alternatives, modifications, and variations thereof will be apparent to those skilled in the art. Accordingly, it is intended that the claimed subject matter be viewed broadly and defined as set forth in the accompanying claims.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

Additional example implementations are as follows:

Example 1 is any of a method, system, apparatus or computer-readable medium for overcoming error correction coding mis-corrects in non-volatile memory comprising an array of non-volatile memory cells encoded to store multiple pages at different read reference voltage levels and a memory controller communicatively coupled to the array of non-volatile memory cells, the memory controller having a processor to apply a read voltage shift to a read reference voltage level in advance of a read of a page of non-volatile memory cells, verify that the read of the page was correct in accordance with an error correction coding (ECC) scheme, determine an ECC mis-correct based on a read signature of a result of the read that indicates the result includes data from a different page, and detect silent data corruption in a non-volatile memory device containing the array of non-volatile memory cells in which the page is encoded after a determination that the read of the page verified as correct is instead the ECC mis-correct.

Example 2 is any of the method, system, apparatus or computer-readable medium of Example 1, wherein the memory controller includes a moving read reference (MRR) table of entries containing one or more read voltage shifts to apply to the read reference voltage level in any of a left and right direction, a threshold voltage shift for checking for a possible mis-correct, the threshold voltage shift representing an extreme shift that risks causing the memory controller to read a different page, and the processor is further to determine that the read voltage shift applied to the read reference voltage level any of meets or exceeds the threshold voltage shift.

Example 3 is any of the method, system, apparatus or computer-readable medium as in any of Examples 1 and 2, wherein the processor is further to divide bits comprising the result of the read into bit buckets, count a number of the bits in an end-most bucket of the bit buckets and determine the read signature of the result of the read based on the number of the bits counted in the end-most bucket, including any of an overpopulation of bits and a starvation of bits in the end-most bucket.

Example 4 is any of the method, system, apparatus or computer-readable medium as in any of Examples 1 through 3, wherein the end-most bucket is any of a left-most bucket and a right-most bucket.

Example 5 is any of the method, system, apparatus or computer-readable medium as in any of Examples 1 through 4, wherein to verify that the read of the page was correct is based on an ECC check that is closed under linearity, including a linear ECC codeword applied to the result of the read.

Example 6 is any of the method, system, apparatus or computer-readable medium as in any of Examples 1 through 5, wherein the non-volatile memory device containing the array of non-volatile memory cells in which the page is encoded is a multi-level NAND, and the page is any one of an upper, lower, extra and top page of the multi-level NAND.

Example 7 is any of the method, system, apparatus or computer-readable medium as in any of Examples 1 through 6, wherein a cell of the non-volatile memory cells is encoded to store multiple bits using an encoding scheme, the encoding scheme including any of a Multi-Level Cell ("MLC"), Quad-Level Cell ("QLC"), Tri-Level Cell ("TLC"), Penta-Level Cell ("PLC") encoding schemes.

Besides what is described herein, various modifications can be made to the disclosed embodiments and implementations of the invention without departing from their scope. Therefore, the illustrations and examples herein should be construed in an illustrative, and not a restrictive sense. The scope of the invention should be measured solely by reference to the claims that follow.

What is claimed is:

1. A memory controller comprising:
   a read logic to apply a read voltage shift to a read reference voltage level in advance of a read of a page of non-volatile memory cells encoded to store multiple pages;
   an error correction coding (ECC) logic to verify that the read of the page was correct;
   a mis-correct logic to detect silent data corruption in a non-volatile memory device in which the page is located, including to determine whether the read of the page verified as correct is instead an ECC mis-correct; and
   wherein the ECC mis-correct is determined based on a read signature of a result of the read that indicates the result includes data from a different page.

2. The memory controller of claim 1, further comprising:
   a moving read reference (MRR) table of entries containing one or more read voltage shifts to apply to the read reference voltage level in any of a left and right direction;
   a threshold voltage shift for checking for a possible mis-correct, the threshold voltage shift representing an extreme shift that risks causing the read logic to read a different page; and
   wherein the mis-correct logic is performed upon a determination that the read voltage shift applied to the read reference voltage level any of meets or exceeds the threshold voltage shift.

3. The memory controller of claim 1, wherein the mis-correct logic includes logic to:
   divide bits comprising the result of the read into bit buckets;
   count a number of the bits in an end-most bucket of the bit buckets; and
   determine the read signature of the result of the read based on the number of the bits counted in the end-most bucket, including any of an overpopulation of bits and a starvation of bits in the end-most bucket.

4. The memory controller of claim 3, wherein the end-most bucket is any of a left-most bucket and a right-most bucket.

5. The memory controller of claim 1, wherein the ECC logic to verify that the read of the page was correct is based on an ECC check that is closed under linearity, including a linear ECC codeword applied to the result of the read.

6. The memory controller of claim 1, wherein the non-volatile memory device is a multi-level NAND, and the page is any one of an upper, lower, extra and top page of the multi-level NAND.

7. The memory controller of claim 1, wherein a cell of the non-volatile memory cells is encoded to store multiple bits using an encoding scheme, the encoding scheme including any of a Multi-Level Cell ("MLC"), Quad-Level Cell ("QLC"), Tri-Level Cell ("TLC"), Penta-Level Cell ("PLC") encoding schemes.

8. A computer-implemented method comprising:
applying a read voltage shift to a read reference voltage level in advance of a read of a page of non-volatile memory cells encoded to store multiple pages;
verifying that the read of the page was correct in accordance with an error correction coding (ECC) logic;
detecting silent data corruption in a non-volatile memory device containing the non-volatile memory cells in which the page is encoded, including determining whether the read of the page verified as correct is instead an ECC mis-correct; and
wherein the ECC mis-correct is determined based on a read signature of a result of the read that indicates the result includes data from a different page.

9. The computer-implemented method of claim 8, further comprising:
applying a read voltage shift to the read reference voltage level in any of a left and right direction, the read voltage shift selected from a moving read reference (MRR) table of entries containing one or more read voltage shifts;
receiving a threshold voltage shift for checking for a possible mis-correct, the threshold voltage shift representing an extreme shift that risks reading a different page; and
determining whether the read voltage shift applied to the read reference voltage level any of meets or exceeds the threshold voltage shift.

10. The computer-implemented method of claim 8, wherein determining whether the read of the page verified as correct is instead the ECC mis-correct includes:
dividing bits comprising the result of the read into bit buckets;
counting a number of the bits in an end-most bucket of the bit buckets; and
determining the read signature of the result of the read based on the number of the bits counted in the end-most bucket, including any of an overpopulation of bits and a starvation of bits in the end-most bucket.

11. The computer-implemented method of claim 10, wherein the end-most bucket is any of a left-most bucket and a right-most bucket.

12. The computer-implemented method of claim 8, wherein verifying that the read of the page was correct is based on a linear ECC codeword applied to the result of the read.

13. The computer-implemented method of claim 8, wherein the non-volatile memory device is a multi-level NAND, and the page is any one of an upper, lower, extra and top page of the multi-level NAND.

14. The computer-implemented method of claim 8, wherein a cell of the non-volatile memory cells is encoded to store multiple bits using an encoding scheme, the encoding scheme including any of a Multi-Level Cell ("MLC"), Quad-Level Cell ("QLC"), Tri-Level Cell ("TLC"), Penta-Level Cell ("PLC") encoding schemes.

15. A storage system comprising:
an array of non-volatile memory cells encoded to store multiple pages at different read reference voltage levels; and
a memory controller communicatively coupled to the array of non-volatile memory cells, the memory controller having a processor to:
apply a read voltage shift to a read reference voltage level in advance of a read of a page of non-volatile memory cells,
verify that the read of the page was correct in accordance with an error correction coding (ECC) scheme,
determine an ECC mis-correct based on a read signature of a result of the read that indicates the result includes data from a different page, and
detect silent data corruption in a non-volatile memory device containing the array of non-volatile memory cells in which the page is encoded after a determination that the read of the page verified as correct is instead the ECC mis-correct.

16. The storage system of claim 15, wherein:
the memory controller includes:
a moving read reference (MRR) table of entries containing one or more read voltage shifts to apply to the read reference voltage level in any of a left and right direction;
a threshold voltage shift for checking for a possible mis-correct, the threshold voltage shift representing an extreme shift that risks causing the memory controller to read a different page; and
the processor is further to determine that the read voltage shift applied to the read reference voltage level any of meets or exceeds the threshold voltage shift.

17. The storage system of claim 15, wherein the processor is further to:
divide bits comprising the result of the read into bit buckets;
count a number of the bits in an end-most bucket of the bit buckets; and
determine the read signature of the result of the read based on the number of the bits counted in the end-most bucket, including any of an overpopulation of bits and a starvation of bits in the end-most bucket.

18. The storage system of claim 17, wherein the end-most bucket is any of a left-most bucket and a right-most bucket.

19. The storage system of claim 15, wherein to verify that the read of the page was correct is based on an ECC check that is closed under linearity, including a linear ECC codeword applied to the result of the read.

20. The storage system of claim 15, wherein the non-volatile memory device containing the array of non-volatile memory cells in which the page is encoded is a multi-level NAND, and the page is any one of an upper, lower, extra and top page of the multi-level NAND.

21. The storage system of claim 15, wherein a cell of the non-volatile memory cells is encoded to store multiple bits using an encoding scheme, the encoding scheme including any of a Multi-Level Cell ("MLC"), Quad-Level Cell ("QLC"), Tri-Level Cell ("TLC"), Penta-Level Cell ("PLC") encoding schemes.

* * * * *